(12) United States Patent
Pilukaitis et al.

(10) Patent No.: US 6,264,093 B1
(45) Date of Patent: Jul. 24, 2001

(54) LEAD-FREE SOLDER PROCESS FOR PRINTED WIRING BOARDS

(76) Inventors: Raymond W. Pilukaitis, 7422 Hardwick Dr., Garland, TX (US) 75044; Yi T. Shih, 2805 Forrest Grove Ave., Richardson, TX (US) 75080; Thang D. Truong, 554 Clayton St., Grand Prairie, TX (US) 75052; William L. Woods, 9453 County Rd. 133, Kaufman, TX (US) 75142

( * ) Notice: Subject to any disclaimer, the term of this patent is extended or adjusted under 35 U.S.C. 154(b) by 0 days.

(21) Appl. No.: 09/184,753

(22) Filed: Nov. 2, 1998

(51) Int. Cl.$^7$ .............................. B23K 31/02; B23K 35/22
(52) U.S. Cl. ...................................... 228/180.1; 228/123.1
(58) Field of Search .............................. 228/180.1, 179.1, 228/118, 122.1, 175, 178, 187, 262.45, 123.1; 361/748, 779, 790, 792, 803; 257/693, 737, 738; 174/257; 420/561, 560; 438/612

(56) References Cited

U.S. PATENT DOCUMENTS

| | | | |
|---|---|---|---|
| 4,398,975 | * 8/1983 | Ohsawa et al. | 148/400 |
| 4,515,304 | * 5/1985 | Berger | 228/136 |
| 4,769,309 | * 9/1988 | King et al. | 430/311 |
| 5,048,166 | * 9/1991 | Wakamatsu | 29/830 |
| 5,129,573 | * 7/1992 | Duffey | 228/180.1 |
| 5,316,205 | * 5/1994 | Melton | 228/180.21 |
| 5,320,272 | * 6/1994 | Melton et al. | 228/180.21 |
| 5,328,660 | * 7/1994 | Gonya et al. | 420/562 |
| 5,338,209 | * 8/1994 | Brooks et al. | . |
| 5,393,489 | * 2/1995 | Gonya et al. | 420/561 |
| 5,439,639 | * 8/1995 | Vianco et al. | 420/562 |
| 5,463,191 | * 10/1995 | Bell et al. | 174/263 |
| 5,536,908 | * 7/1996 | Etchells et al. | 174/257 |
| 5,617,300 | * 4/1997 | Anzawa et al. | 361/795 |
| 5,796,586 | * 8/1998 | Lee et al. | . |
| 5,863,406 | * 1/1999 | Mazzoni et al. | 205/126 |
| 5,902,472 | * 5/1999 | Arai et al. | . |
| 5,973,932 | * 10/1999 | Nguyen | 361/779 |
| 6,045,604 | * 4/2000 | Cavallotti et al. | . |
| 6,082,610 | * 7/2000 | Shangguan et al. | . |

OTHER PUBLICATIONS

Lyman, Taylor. 1973. Metals handbook 8th edition: Metallography, Structures and Phase Diagrams. p. 269.*

Metals Handbook Ninth Edition vol. 6. Welding, Brazing, and Soldering. p. 1075.*

* cited by examiner

*Primary Examiner*—Tom Dunn
*Assistant Examiner*—Jonathan Johnson

(57) ABSTRACT

The present invention provides a method for soldering components to a printed wiring board. In one embodiment, the method comprises applying a substantially lead-free solder to the printed wiring board, placing an electronic component having lead-free terminals on the solder, and heating the printed wiring board in a substantially oxygen-free atmosphere to a temperature sufficient to reflow the solder. In an alternative embodiment, the method may further comprise applying a tin-based solder. In a particularly advantageous embodiment, the method includes applying a solder alloy of tin and a metal selected from the group consisting of: silver, antimony, copper, and gold.

20 Claims, 3 Drawing Sheets

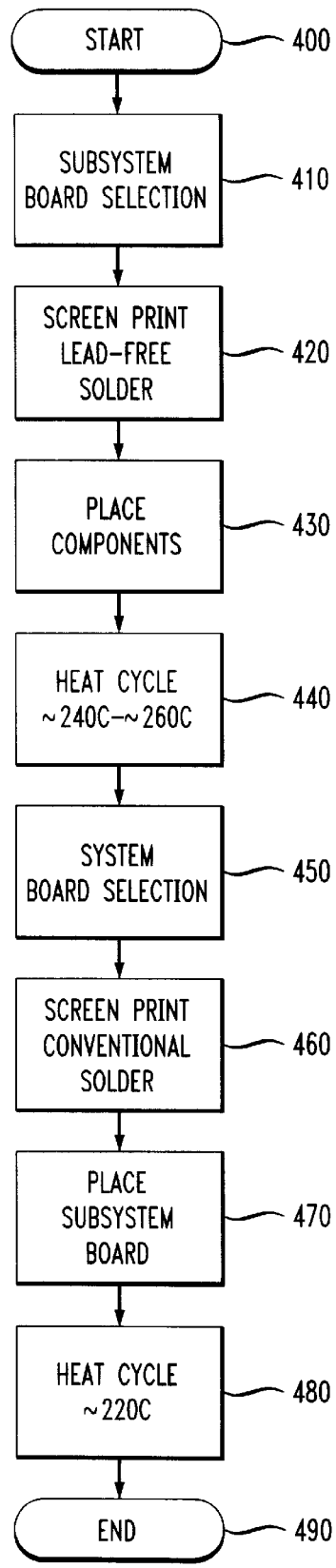

LEAD-FREE SOLDER PROCESS FOR PRINTED WIRING BOARDS

TECHNICAL FIELD OF THE INVENTION

The present invention is directed, in general, to a method of soldering components to printed wiring boards and, more specifically, to a method of forming reliable lead-free solder joints on encapsulated subsystem printed wiring boards that will be subjected to a secondary solder reflow process.

BACKGROUND OF THE INVENTION

Today, many electronic product assemblies are manufactured from components or sub-assemblies provided to a manufacturer by a vendor/subcontractor. A common method of assembly of such products is to connect leads/terminals of the components or subsystem printed wiring assemblies (PWAs) onto the main system PWB by mass soldering. The two most common continuous mass soldering processes are wave soldering and reflow soldering. Wave soldering is commonly used when a high mix of through-hole components are involved in the product assemblies. On the other hand, the reflow soldering process is employed when most components are surface-mounted. In reflow soldering, the entire product assembly is subjected to a specific temperature profile sufficient to reliably melt the solder, forming the interconnects between the main system PWB and the subsystem PWB.

The most common standard tin/lead (60/40 or 63/37 Sn/Pb) solder is an alloy the melting temperature (183° C.) of which is lower than either of its pure components' melting points. That is, Sn melts at 232° C. and Pb melts at 328° C. A wide range of solder alloy compositions, ranging from 80 percent Sn with 20 percent Pb to 15 percent Sn with 85 percent Pb, has the solidus melting point of 183° C. When the encapsulated subsystems or components are subjected to a standard 60/40 or 63/37 Sn/Pb temperature profile, their internal components can reach a temperature of about 20° C. above the melting temperature of the solder alloy. Obviously, if the same solder alloy is used in the manufacture of a subsystem printed wiring assembly, then the solder joints of the components in the subsystem will melt at the same time when the new joints between the main product assembly and the subsystem PWB are formed. Such a condition can cause solder joints on the encapsulated subsystem PWB to fail or components to move when the solder is in the liquidus state. Therefore, with most subassemblies the encapsulated subcontractor-supplied PWAs must provide a thermal guard band between the internal solder joint temperature of the subsystem PWAs and the melting temperature of the solder alloy used in the assembly of the subsystem, especially when the subsystem is subjected to a standard 60/40 Sn/Pb reflow process. This guard band is 20° C. minimum.

One approach to a higher melting point for soldering subsystem boards is to move toward a lead-rich solder, i.e., Pb >85 percent. However, at a 90 percent lead alloy, lead/tin solder melts at 268° C. Unfortunately, this temperature is in excess of the temperature to which most electronic components are certified. Therefore, one is led to tin-rich solder alloys. These alloys typically melt at temperatures below 250° C. However, virtually all components received from suppliers have metalization on the connecting leads that contains some lead.

Referring now to FIG. 1, illustrated is a conventional solder joint of a surface-mounted component on a PWB. When a component lead 110 is conventionally soldered to a copper trace 130 on a PWB 140, lead in the presence of tin combines with other impurities to form tertiary alloys at an intermetallic layer 120 between a solder ball 150 and the copper trace 130. The tertiary alloys may be of tin/lead in combination with silver, bismuth, antimony, or indium. These tertiary alloys have significantly lower melting points than the eutectic point of the reflow tin/lead solder, i.e., 183° C. Thus, when reflow is accomplished, these tertiary alloys melt before the process temperature required to assure reflow is achieved, and the subsystem joints fail prematurely. This can cause a component to move from the desired location on the PWB.

Accordingly, what is needed in the art is a low cost method for forming reliable, lead-free solder joints on encapsulated subsystem PWBs that will be subjected to a reflow process.

SUMMARY OF THE INVENTION

To address the above-discussed deficiencies of the prior art, the present invention provides a method for soldering components to a printed wiring board. In one embodiment, the method comprises applying a substantially lead-free solder to the printed wiring board, placing an electronic component having lead-free terminals on the solder, and heating the printed wiring board in a substantially oxygen-free atmosphere to a temperature sufficient to reflow the solder. In an alternative embodiment, the method may further comprise applying a tin-based solder. Alternatively, the method includes applying a solder alloy of tin and a metal selected from the group consisting of silver, antimony, copper, or gold.

In one advantageous embodiment, the method may include heating the substantially lead-free solder to a temperature ranging from about 240° C. to about 260° C. In another embodiment, the method may include heating the printed wiring board in a nitrogen atmosphere. In one embodiment, the method includes placing an electronic component having terminals coated with tin. Alternatively, the lead-free terminals may be coated with a nickel/palladium alloy.

In another advantageous embodiment, the method includes applying a solder alloy of tin and silver. In a particularly useful embodiment, the printed wiring board is a subsystem printed wiring board and the method further comprises soldering the subsystem printed wiring board to a system printed wiring board using a solder having a eutectic point lower than a eutectic point of the substantially lead-free solder. In yet another embodiment, the method includes applying a solder substantially free of lead, containing only trace amounts of lead insufficient to form significant amounts of tertiary alloys.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 4 illustrates a flow diagram showing the various operations conducted during manufacture of the components illustrated in FIGS. 2 and 3.

DETAILED DESCRIPTION

It has been found that conventional lead-rich and tin-rich solders can cause the formation of tertiary or eutectic alloys that melt prematurely during a secondary reflow process. When these tertiary or eutectic alloys melt, surface mounted components can move during the reflow processes. In view of the problems with lead-containing conventional solders and reflow processes, a substantially lead-free, tin-based solder may be employed. However, it is imperative that when using tin-based solder, that the component leads and PWB contact surface also be kept lead-free to assure that subsystem solder joints will survive the reflow process. Some component manufacturers will supply components with metalization of the leads with either 100 percent tin or a nickel-palladium alloy for Pb-free terminations. Another method that has been used to create Pb-free leads is to have the leads stripped and re-tinned with a Pb-free compound. Substantially lead-free PWB surface finishes include copper with organic solderability coatings, gold plating, and tin immersion.

When soldering with a tin-based solder, particularly Sn/Ag, the component temperature must be above 221° C. to assure the solder is in its liquidus state. However, at these temperatures an additional problem develops, i.e., oxidation of the copper trace is accelerated. To improve this situation, reflow process in an inert atmosphere, e.g., nitrogen, is recommended.

Figure 1:
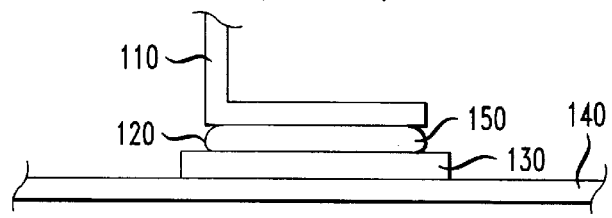
FIG. 1 illustrates a sectional view of a component lead of a surface-mount component soldered to a printed wiring board.
Figure 2:
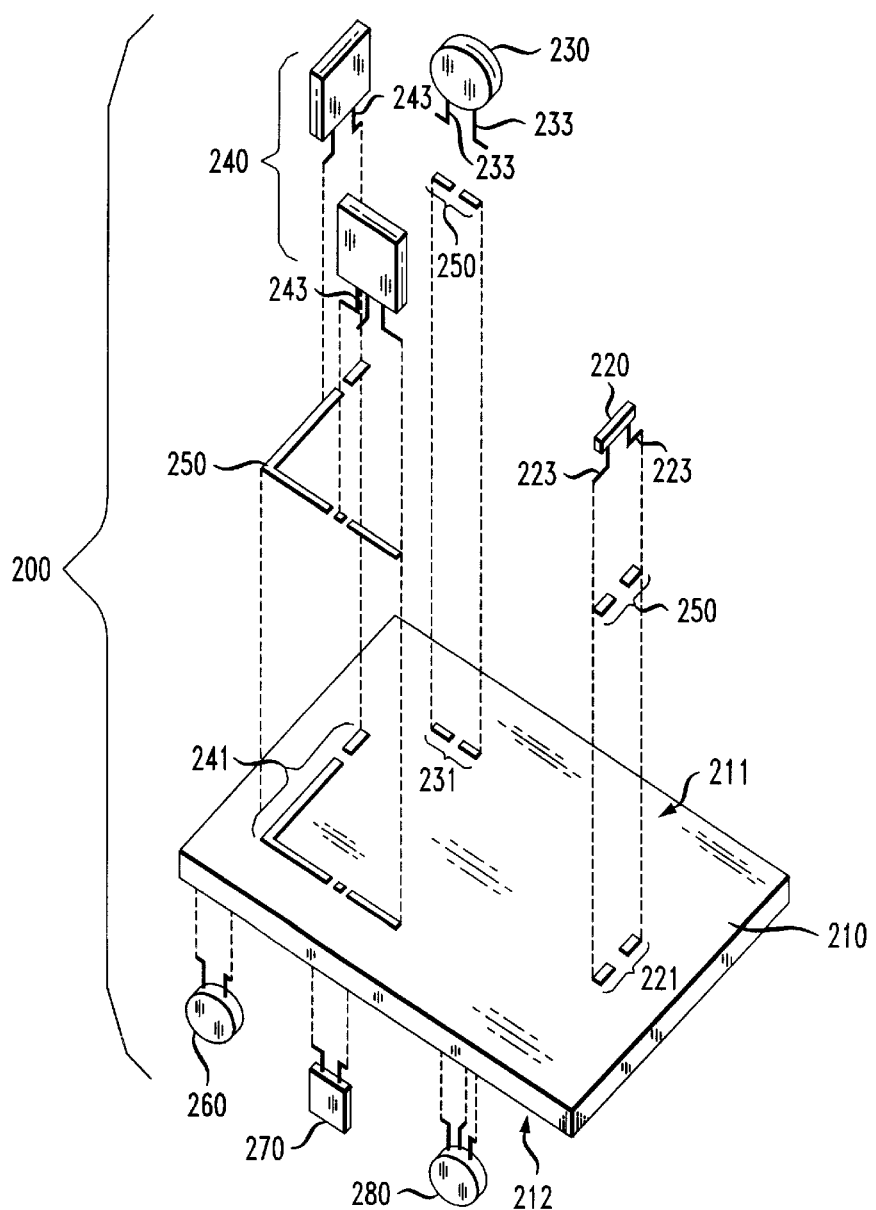
FIG. 2 illustrates an exploded isometric view of a printed wiring board and representative components to be soldered to the printed wiring board.

Referring now to FIG. 2, illustrated is an exploded isometric view of a printed wiring board and representative components to be soldered to the printed wiring board. It should be noted that the present process is particularly useful when soldering surface mounted components. However, the present method may be applicable to other methods of component mounting as well. A printed wiring board (PWB) 210 is prepared for soldering of representative, surface-mount components 220, 230, 240 by conventionally screen printing a substantially lead-free solder 250 layer in required areas 221, 231, 241 on an obverse side 211. In one embodiment of the present invention, the substantially lead-free solder 250 is a tin-based solder. In particular aspects of this embodiment, the tin-based solder may include tin alloyed with silver, antimony, copper, or gold. Other types of substantially lead-free solders known to those who are skilled in the art may also be used.

The components 220, 230, 240, comprising terminal leads 223, 233, 243 respectively, are then placed on the PWB 210 as required by an intended circuit. The assembly of the PWB 210 and the components 220, 230, 240 may then be heated with a hot inert gas to a temperature sufficient to melt (reflow) the solder 250 in a substantially oxygen-free atmosphere; that is, there is not enough oxygen present to form significant amounts of oxide that would substantially decrease the conductivity of the joint. In one embodiment, the PWB 210 and components 220, 230, 240 are subjected to a temperature ranging from about 240° C. to about 260° C. In an alternative embodiment, the heating is conducted in a nitrogen atmosphere, thereby minimizing oxidation of exposed metals. The components 220, 230, 240 are thus electrically and mechanically coupled to the PWB 210, forming a PWB assembly 200. In one embodiment of the present invention, the terminal leads 223, 233, 243 are substantially lead-free and may be coated with tin. In an alternative embodiment, the terminal leads 223, 233, 243 are lead-free and may be coated with a nickel/palladium alloy. As used herein, "substantially lead-free" means that the solder or terminal leads are essentially free of lead with the exception, of course, that minute or trace amounts of lead may be present. In a preferred embodiment, however, the solder or terminal leads are totally free of lead; that is, not even minute or trace amounts (e.g., <0.5 percent) of lead are present.

In some applications, the PWB assembly 200 may be designed to accept additional components 260, 270, 280 on a reverse side 212 of the PWB 210. In such applications, the above process would be repeated by screen printing substantially lead-free solder (not visible) to conductive areas, placing the components 260, 270, 280, and exposing the reverse side 212 to a hot inert gas temperature sufficient to melt (reflow) the solder on the reverse side 212 without adversely affecting solder connections previously formed on the obverse side 211. In the embodiment illustrated, the PWB assembly 200 may be a subsystem assembly board designed to be reflowed onto a large system board, such as those used in computers, telecommunication systems or power systems in general.

Figure 3:
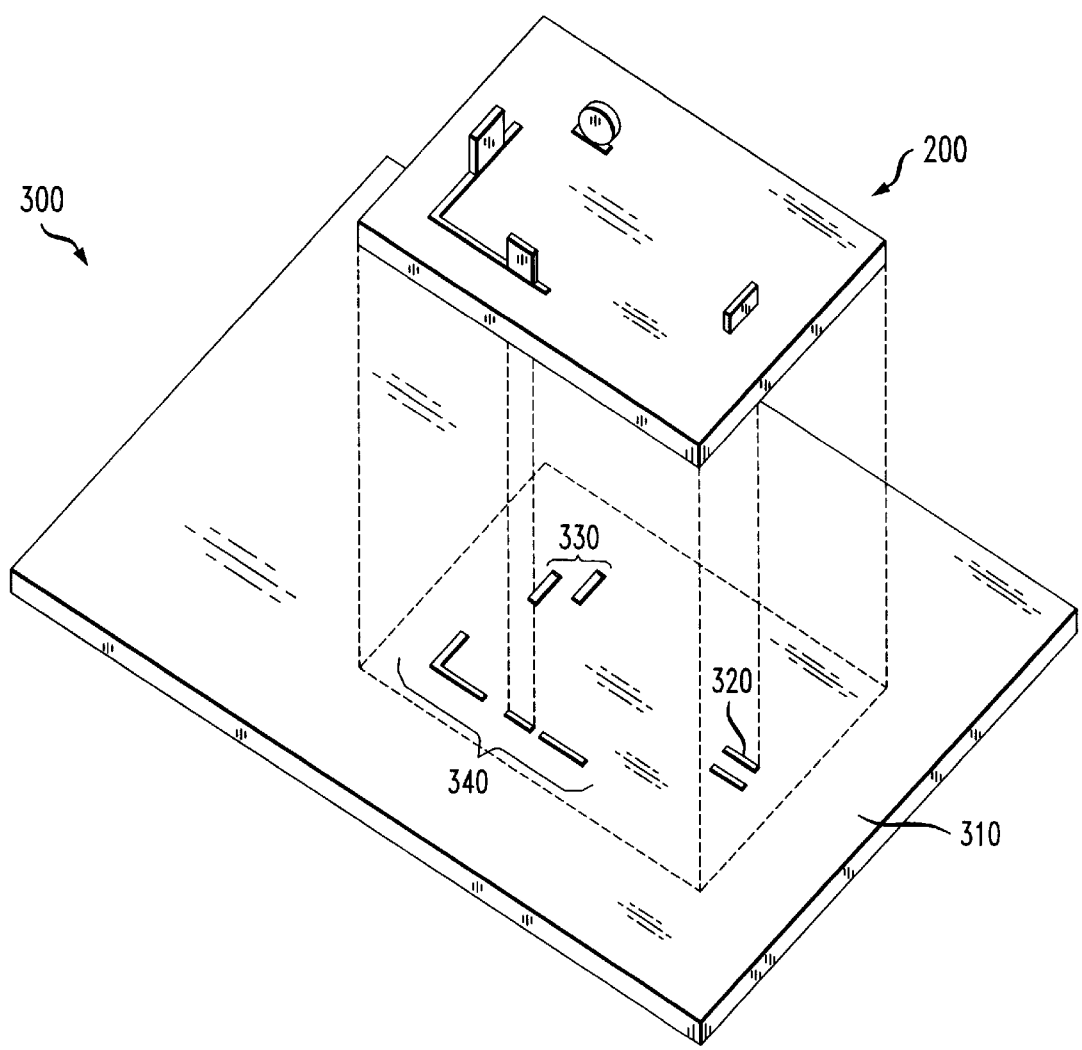
FIG. 3 illustrates an exploded isometric view of the PWB assembly of FIG. 2 and a system printed wiring board.

Referring now to FIG. 3, illustrated is an exploded isometric view of the PWB assembly of FIG. 2 and a system printed wiring board. In the illustrated embodiment, the PWB assembly 200 is a subsystem assembly about to be soldered to a system printed wiring board 310. The system PWB 310 has been prepared by screen printing solder areas 320, 330, 340 with a solder having a eutectic point lower than the eutectic point of the substantially lead-free solder used to assemble the subsystem assembly 200. In one embodiment, the solder areas 320, 330, 340 may comprise a solder containing lead. In a specific aspect of this embodiment, the lead content of the solder may be about 37 percent to about 40 percent. As is well known to one who is skilled in the art, the combined subsystem PWB assembly 100 and the system PWB 310 must be subjected to a heating cycle sufficient to reflow solder areas 320, 330, 340. In most manufacturing this will require a hot air temperature of about 220° C. so as to assure that a core temperature of the solder 320, 330, 340 is at least 183° C., the eutectic point for Pb/Sn solder. As was discussed in relation to FIG. 2, solder connections on the subsystem PWB assembly 200 were formed using a substantially lead-free solder at a temperature (from about 240° C. to about 260° C.) in excess of that required for assembling the subsystem PWB assembly 200 to the system PWB 310 (about 220° C.) Therefore, the reflow process of assembling the subsystem PWB assembly 200 to the system PWB 310 is achieved at a temperature that does not affect prior lead-free solder joints. Thus, a system assembly 300 has been formed from the subsystem PWB assembly 200 and the system PWB 310 by electrically interconnecting the PWBs 210, 310. Subject to a suitable design, the present invention may be used to manufacture the system assembly 300 for use in telecommunications, power systems, computers, and consumer electronics applications of many types.

Turning now to FIG. 4 with continuing reference to FIGS. 2 and 3, there is illustrated a flow diagram showing the various operations conducted during manufacture of the components illustrated in FIGS. 2 and 3. As shown, the process starts at 400. At 410, a subsystem board 210 is selected. The substantially lead-free solder 250 is then screen printed to selected locations 221, 231, 241 to the subsystem board 210 at 420. At 430, the components 220, 230, 240 are placed on the subsystem board 210 as required for the intended circuit. The assembly 200 is subjected to heating in an oxygen-free atmosphere of about 240° C. to about 260° C. at 440. As previously discussed, components 260, 270, 280 may be affixed, if required, to the reverse side 212 of the subsystem board 210 by appropriately repeating 420, 430, 440.

At 450, system board 310 is selected. Conventional Pb/Sn solder is then screen printed to selected locations 320, 330, 340 to the system board 310 at 460. At 470, subsystem assembly 200 is placed over locations 320, 330, 340 of system board 310. The subsystem assembly 200 and system board 310 are subjected to a heating cycle of about 220° C. to melt solder traces 320, 330, 340, forming system assembly 300 at 480. The process ends at 490.

Although the present invention has been described in detail, those skilled in the art should understand that they can make various changes, substitutions and alterations herein without departing from the spirit and scope of the invention in its broadest form.

What is claimed is:

1. A method for soldering components to a printed wiring board, comprising:

providing a printed wiring board having a conductive trace located thereon, said conductive trace having a coating deposited thereon;

applying a substantially lead-free solder to said printed wiring board and onto said coating;

placing an electronic component having lead-free terminals on said substantially lead-free solder;

heating said printed wiring board in a substantially oxygen-free atmosphere to a temperature sufficient to reflow said substantially lead-free solder and disperse said coating such that said lead-free solder comes into direct contact with said conductive trace.

2. The method as recited in claim 1 wherein applying a substantially lead-free solder includes applying a tin-based solder.

3. The method as recited in claim 2 wherein applying a tin-based solder includes a solder alloy of tin and a metal selected from the group consisting of:

silver, antimony, copper, and gold.

4. The method as recited in claim 1 wherein heating to a temperature sufficient to reflow said substantially lead-free solder includes heating said substantially lead-free solder to a temperature ranging from about 240° C. to about 260° C.

5. The method as recited in claim 1 wherein heating said printed wiring board in a substantially oxygen-free atmosphere includes heating said printed wiring board in a nitrogen atmosphere.

6. The method as recited in claim 1 wherein placing an electronic component having lead-free terminals on said substantially lead-free solder includes placing an electronic component having terminals coated with tin.

7. The method as recited in claim 1 wherein placing an electronic component having lead-free terminals on said substantially lead-free solder includes placing an electronic component having lead-free terminals coated with a nickel/palladium alloy.

8. The method as recited in claim 1 wherein applying a substantially lead-free solder includes applying a tin/silver alloy.

9. The method as recited in claim 1 wherein said printed wiring board is a subsystem printed wiring board and said method further comprises soldering said subsystem printed wiring board to a system printed wiring board using a solder having a eutectic point lower than a eutectic point of said substantially lead-free solder.

10. The method as recited in claim 1 wherein applying a substantially lead-free solder includes applying a solder substantially free of lead wherein a solder substantially free of lead comprises only trace amounts of lead insufficient to form significant amounts of tertiary alloys.

11. A method for fabricating a printed wiring board comprising:

providing a subsystem printed wiring board, having a conductive trace located thereon, said conductive trace having a coating deposited thereon;

applying a substantially lead-free solder to said subsystem printed wiring board and onto said coating;

placing an electronic component having lead-free terminals on said substantially lead-free solder;

heating said subsystem printed wiring board in a substantially oxygen-free atmosphere to a temperature sufficient to reflow said substantially lead-free solder and disperse said coating such that said lead-free solder comes into direct contact with said conductive trace; and soldering said subsystem printed wiring board to said printed wiring board using a solder having a eutectic point lower than a eutectic point of said substantially lead-free solder.

12. The method as recited in claim 11 further comprising designing said printed wiring board for use in a telecommunications system.

13. The method as recited in claim 11 further comprising designing said printed wiring board for use in a computer system.

14. The method as recited in claim 11 further comprising designing said printed wiring board for use in a power system.

15. The method as recited in claim 11 wherein applying a substantially lead-free solder includes applying a tin-based solder.

16. The method as recited in claim 15 wherein applying a tin-based solder includes applying a solder alloy of tin and a metal selected from the group consisting of:

silver, antimony, copper, and gold.

17. The method as recited in claim 11 wherein using a solder having a eutectic point lower than a eutectic point of said substantially lead-free solder includes using a solder alloy having a lead content of at least 20 percent.

18. The method as recited in claim 11 wherein heating said subsystem printed wiring board in a substantially oxygen-free atmosphere includes heating said subsystem printed wiring board in a nitrogen atmosphere.

19. The method as recited in claim 11 wherein placing an electronic component having lead-free terminals on said substantially lead-free solder includes placing an electronic component having terminals coated with tin.

20. The method as recited in claim 11 wherein placing an electronic component having lead-free terminals on said substantially lead-free solder includes placing an electronic component having lead-free terminals coated with a nickel/palladium alloy.

* * * * *